United States Patent
Zhang et al.

(10) Patent No.: US 10,211,147 B2
(45) Date of Patent: Feb. 19, 2019

(54) METAL-INSULATOR-METAL CAPACITORS WITH DIELECTRIC INNER SPACERS

(71) Applicant: GLOBALFOUNDRIES Inc., Grand Cayman (KY)

(72) Inventors: Xunyuan Zhang, Troy, NY (US); Chanro Park, Clifton Park, NY (US); Lei Sun, Altamont, NY (US); Yi Qi, Niskayuna, NY (US); Roderick Augur, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 168 days.

(21) Appl. No.: 15/643,032

(22) Filed: Jul. 6, 2017

(65) Prior Publication Data

US 2019/0013269 A1    Jan. 10, 2019

(51) Int. Cl.
| | | |
|---|---|---|
| H01L 21/00 | (2006.01) |
| H01L 23/00 | (2006.01) |
| H01L 23/522 | (2006.01) |
| H01L 23/528 | (2006.01) |
| H01L 49/02 | (2006.01) |
| H01L 21/768 | (2006.01) |
| H01L 21/311 | (2006.01) |
| H01L 21/3213 | (2006.01) |

(52) U.S. Cl.
CPC .... *H01L 23/5223* (2013.01); *H01L 21/31144* (2013.01); *H01L 21/32139* (2013.01); *H01L 21/76805* (2013.01); *H01L 21/76831* (2013.01); *H01L 21/76877* (2013.01); *H01L 23/528* (2013.01); *H01L 23/5226* (2013.01); *H01L 28/60* (2013.01)

(58) Field of Classification Search
CPC ......... H01L 21/31144; H01L 21/32139; H01L 21/76805; H01L 21/76831; H01L 21/76877; H01L 21/76834; H01L 21/76852; H01L 21/28088; H01L 23/5223; H01L 23/5226; H01L 23/528; H01L 28/60; H01L 28/55; H01L 28/40
See application file for complete search history.

(56) References Cited

U.S. PATENT DOCUMENTS

5,583,359 A * 12/1996 Ng .................. H01L 23/5223
                                                              257/306
6,362,012 B1    3/2002 Chi et al.
(Continued)

*Primary Examiner* — Nikolay K Yushin
(74) *Attorney, Agent, or Firm* — Thompson Hine LLP; Anthony Canale (57) ABSTRACT

Methods for fabricating a structure that includes a metal-insulator-metal (MIM) capacitor and structures that include a MIM capacitor. A layer stack is deposited that includes a first conductor layer, a second conductor layer, and a third conductor layer. The layer stack is patterned to define a first electrode of the MIM capacitor from the first conductor layer, a second electrode of the MIM capacitor from the second conductor layer, and a third electrode of the MIM capacitor from the third conductor layer. A via opening is formed that extends vertically through the layer stack. The first electrode is recessed relative to the second electrode to define a cavity that is laterally offset from the via opening. A dielectric inner spacer is formed in the cavity. A conductive via is formed in the first via opening after the dielectric inner spacer is formed.

20 Claims, 4 Drawing Sheets

(56) References Cited

U.S. PATENT DOCUMENTS

| | | |
|---|---|---|
| 8,853,762 B2 | 10/2014 | Tu et al. |
| 2007/0057302 A1 | 3/2007 | Ho et al. |
| 2009/0236691 A1 | 9/2009 | Dyer et al. |
| 2017/0271433 A1* | 9/2017 | Wang .................. H01L 23/5223 |

\* cited by examiner

METAL-INSULATOR-METAL CAPACITORS WITH DIELECTRIC INNER SPACERS

BACKGROUND

The invention relates generally to semiconductor device fabrication and, in particular, to methods for fabricating a structure that includes a metal-insulator-metal (MIM) capacitor and structures that include a MIM capacitor.

On-chip passive elements, such as MIM capacitors, are deployed in many types of integrated circuits, such as radiofrequency integrated circuits. A MIM capacitor may be integrated into one or more of the metallization levels of a back-end-of-line (BEOL) interconnect structure using materials that are commonly available in copper BEOL technologies. A two-electrode MIM capacitor includes top and bottom conductive plates, which operate as electrodes, and a capacitor dielectric disposed between the top and bottom conductive plates as an electrical insulator. The capacitance, or amount of charge held by the MIM capacitor per unit of applied voltage, depends among other factors on the area of the top and bottom conductive plates, their separation, and the dielectric constant of the material constituting the capacitor dielectric.

Improved methods for fabricating a structure that includes a metal-insulator-metal (MIM) capacitor and structures that include a MIM capacitor are needed.

SUMMARY

In an embodiment of the invention, a structure includes a metal-insulator-metal (MIM) capacitor having a layer stack with a first electrode, a second electrode, and a third electrode. The structure further includes a conductive via in a via opening extending vertically through the layer stack, and a dielectric inner spacer arranged between the first electrode and the conductive feature. The dielectric inner spacer is located in a first cavity that is offset laterally from the via opening and the conductive via.

In an embodiment of the invention, a method includes depositing a layer stack including a first conductor layer, a second conductor layer, and a third conductor layer. The layer stack is patterned to define a first electrode of a metal-insulator-metal (MIM) capacitor from the first conductor layer, a second electrode of the MIM capacitor from the second conductor layer, and a third electrode of the MIM capacitor from the third conductor layer. A via opening is formed that extends vertically through the layer stack. The first electrode is recessed relative to the second electrode to define a cavity that is offset laterally from the via opening. A dielectric inner spacer is formed in the cavity. A conductive via is formed in the via opening after the dielectric inner spacer is formed.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2A is a top view of the device structure in which FIG. 2 is taken generally along line 2-2 and in which the etch mask has been stripped.

DETAILED DESCRIPTION

Figure 1:
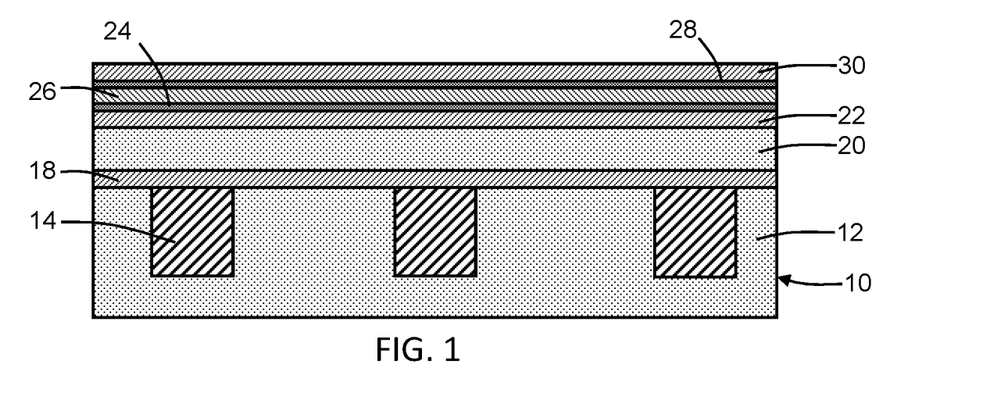
FIGS. 1-7 are cross-sectional views of a device structure at successive fabrication stages of a processing method in accordance with embodiments of the invention.

With reference to FIG. 1 and in accordance with embodiments of the invention, a back-end-of-line (BEOL) interconnect structure includes a dielectric layer 12 constituting an interlayer dielectric (ILD) of a metallization level 10, a conductive wiring features 14 embedded in the dielectric layer 12, and a capping layer 18 on the dielectric layer 12. Additional metallization levels (not shown) may exist below the metallization level 10. The dielectric layer 12 may be comprised of an electrical insulator, such as silicon dioxide ($SiO_2$). The capping layer 18 may be comprised of a nitride-based dielectric material, such as silicon nitride ($Si_3N_4$). The conductive wiring features 14 of the metallization level 10 may be comprised of a metal such as copper, aluminum, or an alloy of these metals. The BEOL interconnect structure, including the metallization level 10, is carried on a die or chip (not shown) that has been processed by front-end-of-line (FEOL) processes, such as a complementary metal-oxide-semiconductor (CMOS) process, to fabricate one or more integrated circuits that contain device structures. Conductive features in the different metallization levels function to interconnect devices of the integrated circuit and may provide circuit-to-circuit connections, or may establish contacts with input and output terminals.

A dielectric layer 20 is formed on the capping layer 18. In an embodiment, the dielectric layer 20 may be comprised of an electrical insulator, such as silicon dioxide ($SiO_2$). Layers 22, 24, 26, 28, 30 are serially formed on the dielectric layer 20 to define a layer stack that is subsequently used to form a MIM capacitor.

Layers 22, 26, and 30 may be comprised of one or more conductive materials (i.e., conductors), such as titanium nitride (TiN), tantalum nitride (TaN), tantalum (Ta), titanium (Ti), tungsten (W), tungsten nitride (WN), a layered stack of the conductive materials (e.g., a bilayer of Ti and TiN), or a combination of these conductive materials. Each conductive material of layers 22, 26, and 30 may be deposited by, for example, physical vapor deposition (PVD) or chemical vapor deposition (CVD). The conductive material of layer 26 is selected to etch selectively to the conductive materials of layer 22 and layer 30, as well as layers 24 and 28. As used herein, the term "selective" in reference to a material removal process (e.g., etching) denotes that, with an appropriate etchant choice, the material removal rate (e.g., etch rate) for the targeted material is greater than the removal rate for at least another material exposed to the material removal process.

Layers 24 and 28 may be comprised of one or more dielectric materials, such as a high-k dielectric material having a dielectric constant (i.e., permittivity) greater than the dielectric constant of $SiO_2$. Suitable high-k dielectrics for layer 24 include, but are not limited to, a hafnium-based dielectric material like hafnium oxide ($HfO_2$), or a layered stack of this dielectric material and other dielectric materials (e.g., aluminum oxide ($Al_2O_3$)).

In an alternative embodiment, the layer stack may be expanded vertically through the addition of additional layer pairs that include one layer analogous to layer 26 and a layer analogous to layer 28 that are placed between layer 28 and layer 30 in the representative layer stack. This modification introduces an additional middle electrode into the MIM capacitor for each added layer pair.

Figure 2:
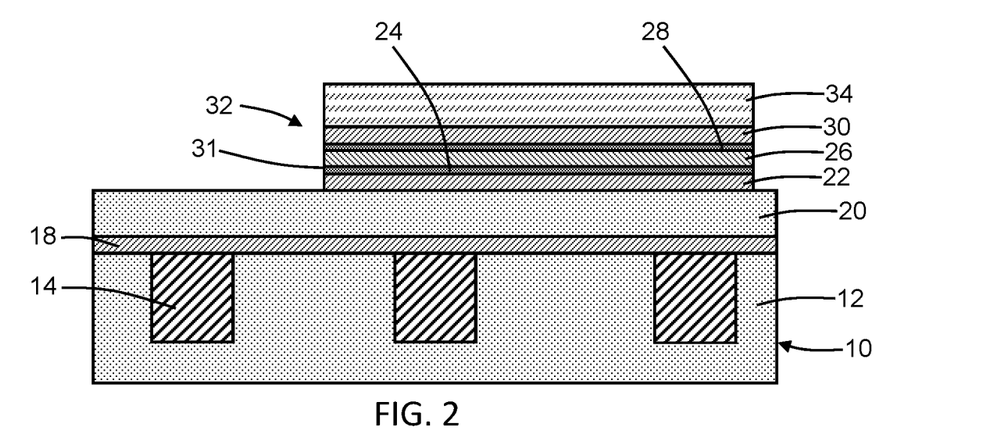
Figure 2A:
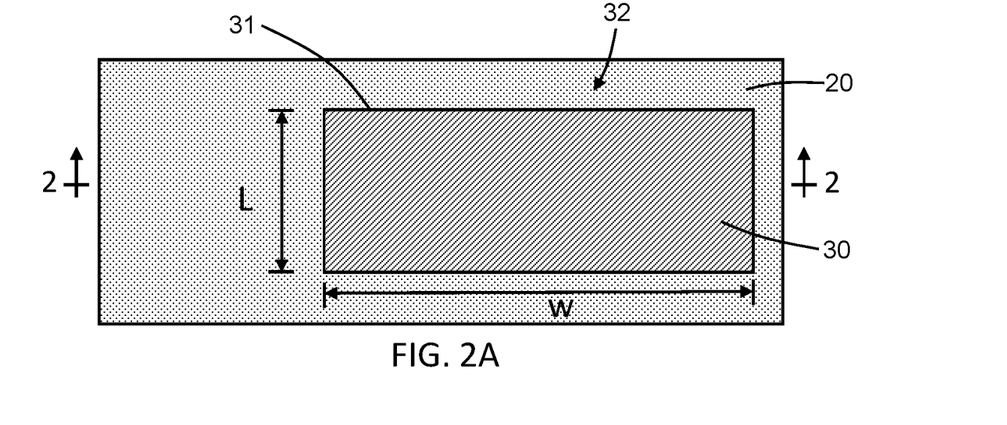

With reference to FIGS. 2, 2A in which like reference numerals refer to like features in FIG. 1 and at a subsequent fabrication stage, the layers 22, 26, and 30 of the layer stack may be patterned to shape the plates or electrodes of a MIM capacitor 32, and the layers 24 and 28 of the layer stack may be patterned to shape the capacitor dielectrics of the MIM capacitor 32. The patterning also reveals an area on the top surface of the dielectric layer 20 adjacent to the MIM capacitor 32 and one of the conductive wiring features 14. To that end, an etch mask 34 including an organic photoresist may be applied to a top surface of layer 30 by spin-coating, pre-baked, exposed to a pattern of radiation from an exposure source projected through a photomask, baked after exposure, and developed with a chemical developer to form an etch mask covering an underlying area intended for the electrodes of the MIM capacitor. Unmasked regions of layers 22, 24, 26, 28, 30 are removed with an etching process, such as reactive ion etching (ME), using different etch chemistries selective to remove each of the constituent materials. After patterning is completed, the etch mask 34 may be removed by, for example, chemical stripping or a plasma ashing process.

The patterned layer 22 constitutes a bottom electrode of the MIM capacitor 32, and the patterned layer 30 constitutes a top electrode of the MIM capacitor 32. The patterned layer 26, which is comprised of a conductor that etches selectively to the conductor of the patterned layers 22 and 30, constitutes a middle electrode of the MIM capacitor 32. The patterned layers 24 and 28, which are comprised of a dielectric material that is an electrical insulator, constitute respective capacitor dielectrics that electrically insulate the middle electrode from the top and bottom electrodes.

A single etch mask 34, which is stripped subsequent to the etching process as shown in FIG. 2A, is used to pattern all of the layers 22, 24, 26, 28, 30 to form the electrodes and capacitor dielectrics. A consequence of the use of the single etch mask 34 is that the electrodes and capacitor dielectrics have the same area and the same footprint projected onto the top surface of the dielectric layer 20. This arrangement differs from conventional arrangements in which the electrodes do not have identical areas and footprints, but merely overlap instead so that the different electrodes can be contacted with vertical interconnections. Each of the patterned layers 22, 24, 26, 28, 30 in the layer stack has the same sidewall 31 as an outer perimeter or boundary. In an embodiment in which the patterned layer stack is rectangular, the patterned layers 22, 24, 26, 28, 30 each have an area equal to the product of the common length (L) and the common width (w).

Figure 3:
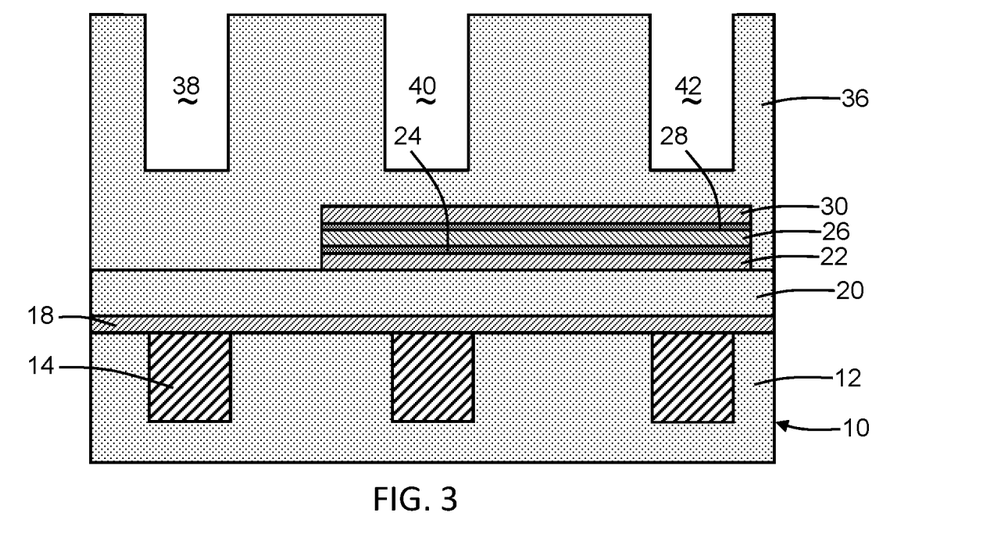

With reference to FIG. 3 in which like reference numerals refer to like features in FIG. 2 and at a subsequent fabrication stage, a dielectric layer 36 is formed on the capping layer 18 and patterned with lithography and etching processes to form trenches 38, 40, 42. In an embodiment, the dielectric layer 36 may be comprised of an electrical insulator, such as silicon dioxide ($SiO_2$). A patterned resist layer (not shown) may be applied on dielectric layer 36 and used to pattern the trenches 38, 40, 42 with an etching process, such as reactive ion etching (ME).

Figure 4:
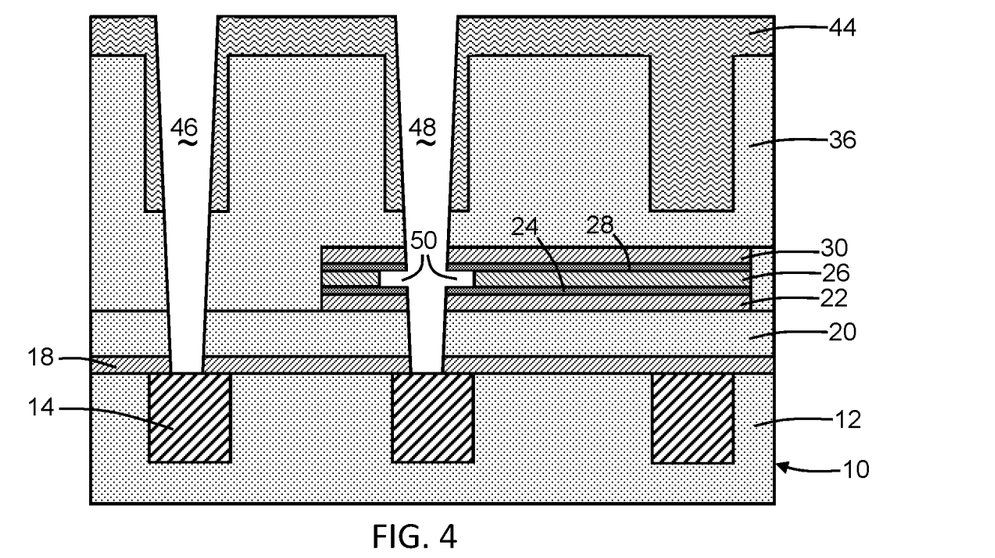

With reference to FIG. 4 in which like reference numerals refer to like features in FIG. 3 and at a subsequent fabrication stage, a sacrificial layer 44 is applied that blocks the trenches 38, 40, 42. The sacrificial layer 44 may be comprised of, for example, an organic planarization layer (OPL) material applied by spin coating. The sacrificial layer 44 is patterned by lithography and etching to form via openings 46, 48 respectively aligned with trenches 38 and 40. The dielectric layer 36, the dielectric layer 20, and the capping layer 18 are subsequently etched to extend the via openings 46, 48 through their thicknesses to conductive wiring features 14 in the metallization level 10. The etching processes, which may employ reactive ion etching (ME), may be conducted in multiple etching steps with different etch chemistries. The trench 42 is occluded and masked by the sacrificial layer 44 when the via openings 46, 48 are formed.

The via opening 48 extends through a section of the dielectric layer 36 between the trench 40 and the MIM capacitor 32, through the layer stack of the MIM capacitor 32, through a section of the dielectric layer 20 between the MIM capacitor 32 and the capping layer 18, and then through the capping layer 18 to one of the conductive wiring features 14. The via opening 48 is used, as discussed hereinbelow, to directly contact the patterned layer 22 constituting the bottom electrode of the MIM capacitor 32 and to directly contact the patterned layer 30 constituting the top electrode of the MIM capacitor 32.

After the via opening 48 is formed, an etching process is used to recess the layer 26 laterally to form a cavity 50 in the layer stack of the MIM capacitor 32. The etching process removes the material of the layer 26 selective to the material of layer 22 and the material of layer 30 such that layers 22 and 30 are not recessed. The cavity 50 defines an indent that is offset laterally from the via opening 48 and extends about the circumference of the via opening 48.

Figure 5:
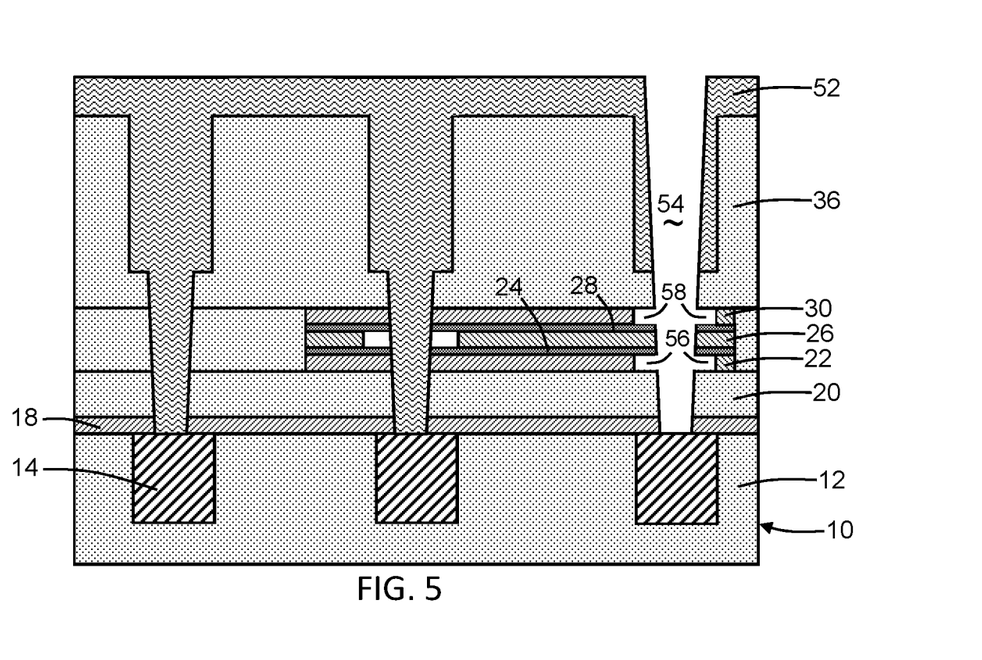

With reference to FIG. 5 in which like reference numerals refer to like features in FIG. 4 and at a subsequent fabrication stage, the sacrificial layer 44 is removed by, for example, ashing, and a sacrificial layer 52 is applied that fills the trenches 38, 40, 42 and the via openings 46, 48. The sacrificial layer 52 may be comprised of, for example, an organic planarization layer (OPL) material applied by spin coating. The sacrificial layer 52 is patterned by lithography and etching to form a via opening 54 aligned with trench 42, and the dielectric layer 36, the dielectric layer 20, and the capping layer 18 are etched to extend the via opening 54 through their thicknesses to a conductive wiring feature 14 in the metallization level 10. The etching process, which may employ reactive ion etching (RIE), may be conducted in a single etching step with a given etch chemistry or in multiple etching steps with different etch chemistries. The trenches 38, 40 and the via openings 46, 48 are masked by the sacrificial layer 52 when the via opening 54 is formed.

The via opening 54 extends through a section of the dielectric layer 36 between the trench 40 and the MIM capacitor 32, through the layer stack of the MIM capacitor 32, through a section of the dielectric layer 20 between the MIM capacitor 32 and the capping layer 18, and then through the capping layer 18 to one of the conductive wiring features 14. The via opening 54 is used, as discussed hereinbelow, to directly contact the patterned layer 26 constituting the middle electrode of the MIM capacitor 32.

After the via opening 54 is formed, an etching process is used to recess the layers 22 and 30 laterally to form cavities 56, 58 in the layer stack of the MIM capacitor 32. The etching process removes the material of the layer 22 and the material of layer 30 selective to the material of layer 26 such that layer 26 is not recessed. The cavities 56, 58 are offset laterally from the via opening 54 and extend about the circumference of the via opening 54.

Figure 6:
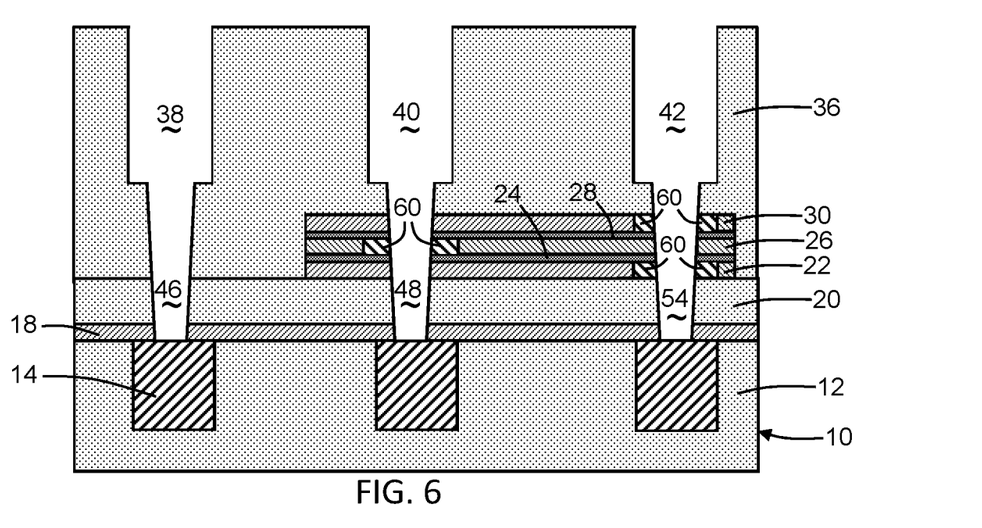

With reference to FIG. 6 in which like reference numerals refer to like features in FIG. 5 and at a subsequent fabrication stage, the sacrificial layer 52 is removed by, for example, ashing such that all of the via openings 46, 48, 54 and all of the trenches 38, 40, 42 are cleared. Inner spacers 60 are concurrently formed in the cavities 50, 56, 58 by depositing a conformal dielectric layer and etching with a wet chemical process to remove the conformal layer from surfaces other than inside those surfaces inside the cavities 50, 56, 58. The inner spacers 60 may be composed of a dielectric material, such as silicon dioxide ($SiO_2$), conformally deposited by atomic layer deposition (ALD). The conformal dielectric layer pinches off inside the cavities 50, 56, 58 during deposition to form the inner spacers 60. The inner spacers 60 adopt the shape of the cavities 50, 56, 58. The inner spacer 60 inside the cavity 50 extends about the circumference of the via opening 48. Similarly, the inner spacers 60 inside the cavities 56, 58 extend about the circumference of the via opening 54. The inner spacers 60 are located interior of the sidewall 31 of the patterned layers 22, 24, 26, 28, 30 in the layer stack.

Figure 7:
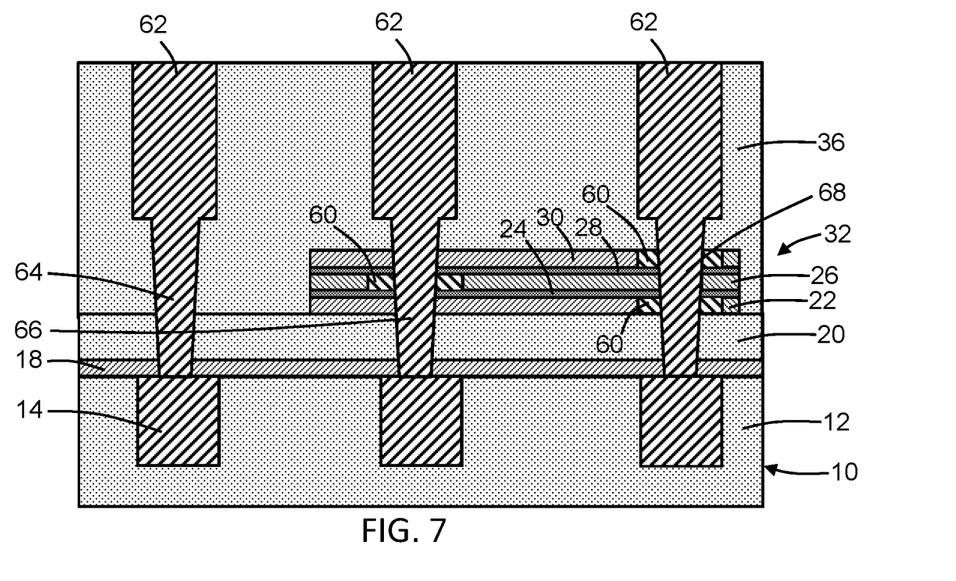

With reference to FIG. 7 in which like reference numerals refer to like features in FIG. 6 and at a subsequent fabrication stage, conductive wiring features 62 are formed inside the trenches 38, 40, 42, and conductive vias 64, 66, 68 are respectively formed inside the via openings 46, 48, 54. Conductive wiring features 62 and conductive vias 64, 66, 68 may be comprised of a conductor such as copper (Cu), aluminum (Al), a binary alloy such as AlCu, and other similar metals. The conductor may be formed by an electrochemical deposition process, such as electroplating or electroless plating.

A chemical-mechanical polishing (CMP) process may be used to remove excess liner material and conductor from the top surface of dielectric layer 36 and to planarize the conductive wiring features 62 to be flush with the top surface of dielectric layer 36. The conductive via 64 electrically and physically connects one of the conductive wiring features 62 with one of the conductive wiring features 14. The conductive via 66 electrically and physically connects the layers 22 and 30 respectively constituting the bottom and top electrodes of the MIM capacitor 32 with one of the conductive wiring features 62 and with one of the conductive wiring features 14. The inner spacers 60 electrically isolate the conductive via 68 from the layer 26 constituting the middle electrode of the MIM capacitor 32. The conductive via 68 electrically and physically connects the layer 26 constituting the middle electrode of the MIM capacitor 32 with one of the conductive wiring features 62 and with one of the conductive wiring features 14. The inner spacers 60 electrically isolate the conductive via 68 from the layers 22 and 30 respectively constituting the bottom and top electrodes of the MIM capacitor 32.

Figure 8:
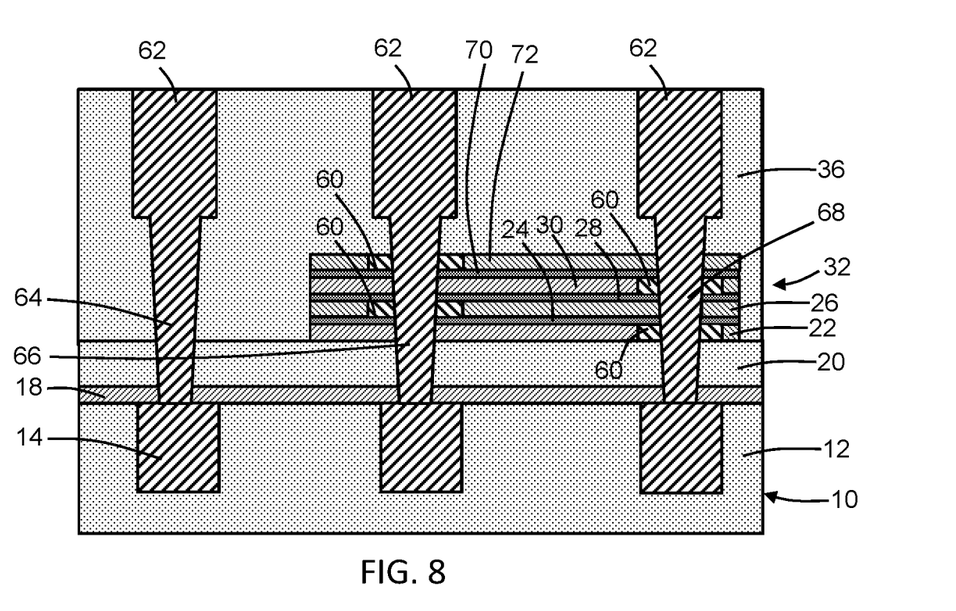
FIG. 8 is a cross-sectional view of a device structure fabricated in accordance with alternative embodiments of the invention.

With reference to FIG. 8 in which like reference numerals refer to like features in FIG. 7 and in accordance with alternative embodiments, the MIM capacitor 32 may be modified to add one or more additional pairs of electrodes and interplate dielectrics in order to expand its charge storage capability while retaining the use of the single etch mask 34 to provide layer patterning. For example, a layer 70 comprised of the same dielectric material as layers 24 and 28 may provide an additional capacitor dielectric that is added to the layer stack of the MIM capacitor 32, and a layer 72 that is comprised of the same conductor as layer 26 may provide an additional electrode that is added to the layer stack of the MIM capacitor 32. The electrode formed from the layer 72 is connected with the conductive via 68 and is isolated from the conductive via 66 by inner spacers 60. Alternatively, the layer 72 may be comprised of the same conductor as layers 22, 28 to provide an additional electrode that is added to the layer stack of the MIM capacitor 32, in which instance the electrode formed from the layer 72 would be connected with the conductive via 66 and is isolated from the conductive via 68 by inner spacers 60.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
a metal-insulator-metal (MIM) capacitor including a layer stack with a first electrode, a second electrode, and a third electrode;
a first conductive via in a first via opening extending vertically through the layer stack; and
a first dielectric inner spacer arranged between the first electrode and the first conductive via, the first dielectric inner spacer located in a first cavity that is offset laterally from the first conductive via and the first via opening,
wherein the second electrode is arranged vertically between the first electrode and the third electrode, the first electrode and the third electrode are composed of a first conductor, and the second electrode is composed of a second conductor that is selected to etch selectively to the first conductor.

2. The structure of claim 1 further comprising:
a second conductive via in a second via opening extending vertically through the layer stack, the second via opening displaced laterally from the first via opening,
wherein the second conductive via is connected with the first electrode.

3. The structure of claim 2 further comprising:
a second dielectric inner spacer arranged between the second electrode and the second conductive via, the second dielectric inner spacer located in a second cavity that is offset laterally from the second via opening.

4. The structure of claim 3 wherein the first electrode is vertically arranged between the second electrode and the third electrode, and further comprising:
a third dielectric inner spacer arranged between the third electrode and the second conductive via, the third dielectric inner spacer located in a third cavity that is offset laterally from the second via opening.

5. The structure of claim 1 wherein the first electrode, the second electrode, and the third electrode have equal areas surrounded by a common sidewall.

6. The structure of claim 5 wherein the layer stack further includes a first capacitor dielectric and a second capacitor dielectric, the first capacitor dielectric arranged between the first electrode and the second electrode, the second capacitor dielectric arranged between the second electrode and the third electrode, and the first capacitor dielectric and the second capacitor dielectric are each surrounded by the common sidewall.

7. The structure of claim 1 further comprising:
a dielectric layer above the MIM capacitor;
a first conductive wiring feature in the dielectric layer; and
a metallization level below the MIM capacitor, the metallization level including a second conductive wiring feature,
wherein the first conductive via and the first via opening extend vertically through the dielectric layer from the first conductive wiring feature through the layer stack to the second conductive wiring feature.

8. A method comprising:
depositing a layer stack including a first conductor layer, a second conductor layer, and a third conductor layer;
patterning the layer stack to define a first electrode of a metal-insulator-metal (MIM) capacitor from the first conductor layer, a second electrode of the MIM capacitor from the second conductor layer, and a third electrode of the MIM capacitor from the third conductor layer;
forming a first via opening extending vertically through the layer stack;
recessing the first electrode relative to the second electrode to define a first cavity that is offset laterally from the first via opening;
forming a first dielectric inner spacer in the first cavity; and
forming a first conductive via in the first via opening.

9. The method of claim 8 wherein the layer stack further includes a first dielectric layer between the first conductor layer and the second conductor layer, a second dielectric layer between the second conductor layer and the third conductor layer, and the first dielectric layer and the second dielectric layer are patterned to define a first capacitor dielectric and a second capacitor dielectric when the layer stack is patterned.

10. The method of claim 8 further comprising:
forming a second via opening extending vertically through the layer stack and displaced laterally from the first via opening;
recessing the third electrode relative to the first electrode to define a second cavity that is offset laterally from the second via; and
forming a second dielectric spacer in the second cavity.

11. The method of claim 10 further comprising:
recessing the second electrode relative to the second electrode to define a third cavity that is offset laterally from the second via opening;
forming a third dielectric spacer in the third cavity; and
forming a second conductive via in the second via opening.

12. The method of claim 8 wherein forming the first dielectric inner spacer in the first cavity comprises:
depositing a conformal layer that is pinched off when filling the first cavity.

13. The method of claim 8 wherein patterning the layer stack comprises:
applying an etch mask that covers an area on the layer stack; and
etching the layer stack with the area masked the etch mask.

14. The method of claim 8 wherein the layer stack is patterned using a single etch mask.

15. The method of claim 8 wherein the first conductor layer is arranged vertically between the second conductor layer and the third conductor layer, the second conductor layer and the third conductor layer are composed of a first conductor, and the first conductor layer is composed of a second conductor that is selected to etch selectively to the first conductor.

16. The method of claim 8 further comprising:
forming a dielectric layer that covers the MIM capacitor:
forming a first trench in the dielectric layer; and
filling the first trench with a first sacrificial layer.

17. The method of claim 16 wherein the first via opening is formed after the first trench is filled with the first sacrificial layer, and forming the first via opening extending vertically through the layer stack comprises:
etching the first via opening through the first sacrificial layer in the first trench;
etching the first via through a first section of the dielectric layer between the first trench and the MIM capacitor; and
etching the first via opening through the layer stack.

18. The method of claim 17 further comprising:
forming a second trench in the dielectric layer; and
filling the second trench with the first sacrificial layer,
wherein the second trench is filled by the first sacrificial layer when the first via opening is formed.

19. The method of claim 18 further comprising:
removing the first sacrificial layer from the first trench and the second trench;
filling the first trench, the second trench, and the first via opening with a second sacrificial layer; and
forming a second via opening extending vertically through the second sacrificial layer in the second trench, a second section of the dielectric layer between the second trench and the MIM capacitor, and the layer stack, wherein the second via opening is displaced laterally from the first via opening, and the first trench and first via opening are filled by the second sacrificial layer when the second via opening is formed.

20. A structure comprising:
a metal-insulator-metal (MIM) capacitor including a layer stack with a first electrode, a second electrode, and a third electrode;
a first conductive via in a first via opening extending vertically through the layer stack;
a first dielectric inner spacer arranged between the first electrode and the first conductive via, the first dielectric inner spacer located in a first cavity that is offset laterally from the first conductive via and the first via opening;
a dielectric layer over the MIM capacitor;
a first conductive wiring feature in the dielectric layer; and
a metallization level below the MIM capacitor, the metallization level including a second conductive wiring feature,
wherein the first conductive via and the first via opening extend vertically through the dielectric layer from the first conductive wiring feature through the layer stack to the second conductive wiring feature.

* * * * *